United States Patent [19]
Boulic

[11] Patent Number: 6,097,936
[45] Date of Patent: Aug. 1, 2000

[54] RECEPTION DEVICE FOR MICROWAVE SIGNALS

[75] Inventor: Claude Boulic, Paray Vieille Poste, France

[73] Assignee: TRT Lucent Technologies SA, Le Plessis Robinson, France

[21] Appl. No.: 09/108,333

[22] Filed: Jun. 30, 1998

[30] Foreign Application Priority Data

Jul. 2, 1997 [FR] France ................................... 97 08625

[51] Int. Cl.$^7$ ............................... H04B 1/06; H03F 3/45
[52] U.S. Cl. ..................................... 455/239.1; 455/245.1; 455/249.1; 455/251.1
[58] Field of Search ........................... 455/232.1, 234.1, 455/234.2, 239.1, 240.1, 241.1, 249.1, 250.1, 251.1; 375/345

[56] References Cited

U.S. PATENT DOCUMENTS

| | | | |
|---|---|---|---|
| 3,379,977 | 4/1968 | Etal | 455/239.1 |
| 4,017,804 | 4/1977 | Hunsinger | 330/29 |
| 4,263,560 | 4/1981 | Ricker | 455/239.1 |
| 4,553,105 | 11/1985 | Sasaki | 455/250.1 |
| 4,707,639 | 11/1987 | Truskalo | 315/382 |
| 5,389,893 | 2/1995 | Itri et al. | 330/254 |
| 5,627,486 | 5/1997 | Gross | 327/108 |
| 5,732,342 | 3/1998 | Roth et al. | 455/234.1 |

FOREIGN PATENT DOCUMENTS

| | | | |
|---|---|---|---|
| WO 96/31946 | 10/1996 | Finland . | |
| 59-168728 | 9/1984 | Japan | 455/249.1 |
| 2-55428 | 2/1990 | Japan | 455/249.1 |

*Primary Examiner*—Reinhard J. Eisenzopf
*Assistant Examiner*—Duc Nguyen
*Attorney, Agent, or Firm*—Nilles & Nilles SC

[57] ABSTRACT

The present invention relates to a reception device for microwave signals, in which it is possible to extract information (V2) linearly dependent on the power level received at the input of the said device. According to the invention, the profile of the control voltage of the variable power attenuators (6, 7, 8) of the device is modified in order to obtain a curve of the control voltage which is of hyperbolic shape, and this voltage is linearized by a polynomial unit (11).

Application for the production of point-to-point links in the field of directional millimeter radio.

7 Claims, 3 Drawing Sheets

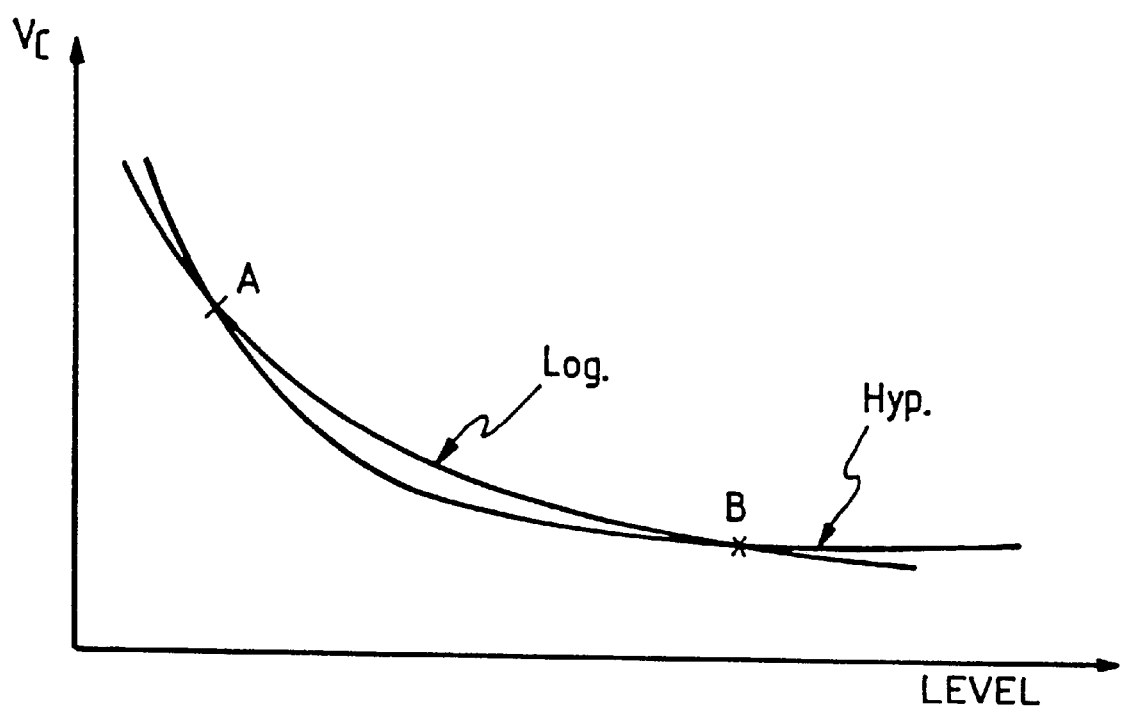
FIG_2

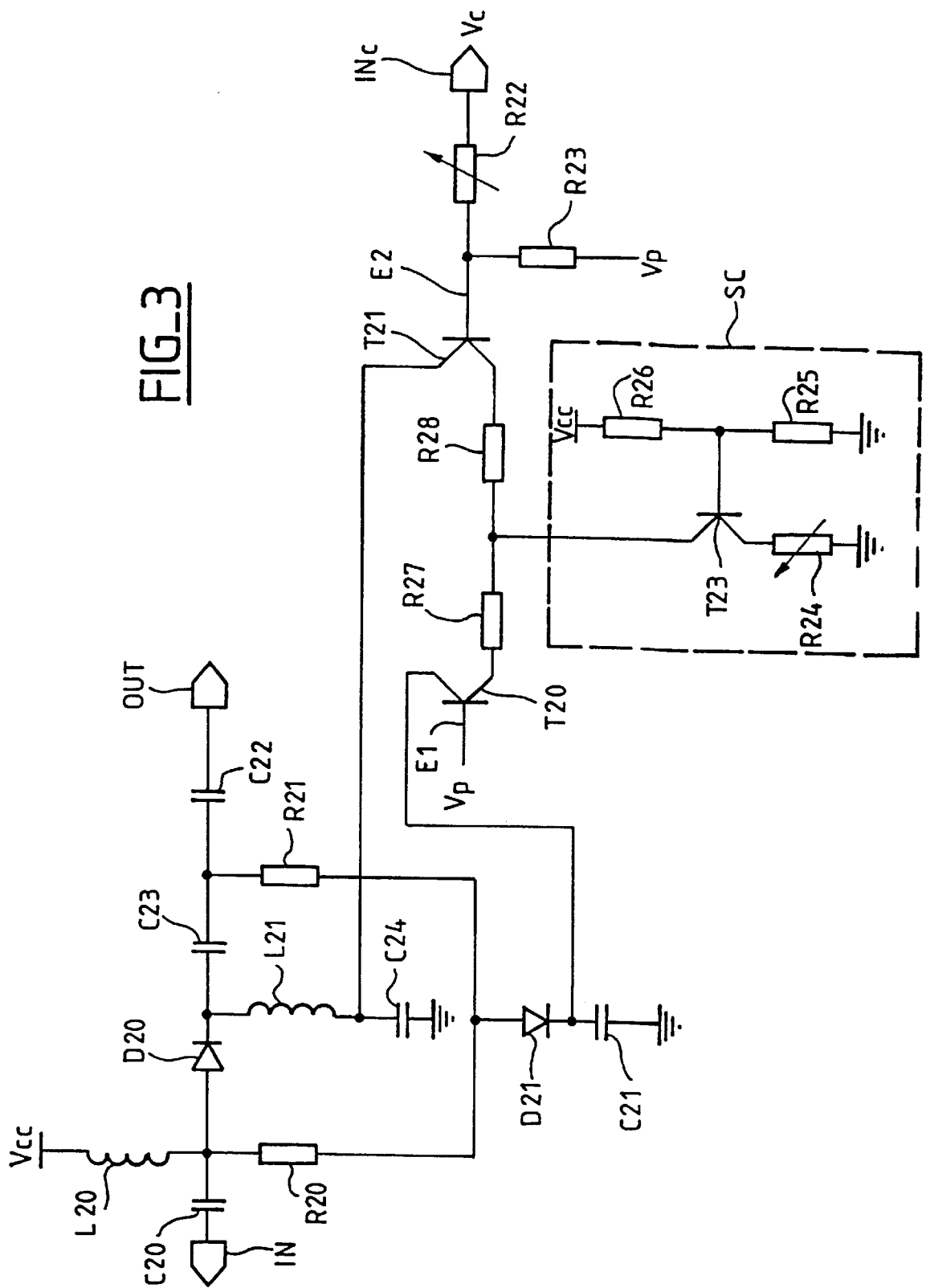
FIG_3

RECEPTION DEVICE FOR MICROWAVE SIGNALS

BACKGROUND OF THE INVENTION

1. Field of the Invention

The present invention relates to a reception device for microwave signals. The application of the invention lies in the production of point-to-point links in the field of directional millimeter radio.

A microwave signal reception system is conventionally composed of filters, amplifiers, mixers and attenuators, as well as slaving means for setting the level of the signal at the system output. It is in actual fact necessary to control the gain of the reception system because, unlike with cable transmissions, in directional radio the received power can undergo very strong variations on account of changes in the propagation conditions. The gain of the reception system can generally be set by means of voltage-controlled variable attenuators.

The conventional way of ensuring correct operation of the reception system when it is installed is to extract information from the output of the system which is representative of the power level received at the input of the system, and to compare this information with the actual power level received by the system. The latter level is determined by the power level transmitted by the transmission system of the link, from which the losses due to attenuation in free space have been subtracted. In order for the result of the comparison to be usable, it is necessary for the information to be as representative as possible of the received level, which is why the information needs to be linearly dependent on the received level.

2. Description of the Related Art

There are a number of known solutions for obtaining information of this type. Firstly, provision may be made to use a reception system whose amplification is logarithmic. This system then delivers a signal whose voltage is perfectly linear as a function of the power level at the input of the system. However, this type of system is applicable only for constant-envelope signals which do not require amplitude linearity from the reception system. This system is therefore of limited interest.

A second possibility consists in using a reception system whose amplification is linear and in using the control voltage delivered by the slaving means (automatic gain control) of the system. By virtue of its linearity, this reception system is capable of processing any type of signals. The control voltage is dependent on the power level received at the input of the system, but the corresponding curve is of logarithmic shape, which means that the slope of the curve is high for low power levels and low for high levels. This solution is therefore not satisfactory because the information which is gathered is not then precise enough for high power levels.

A third solution might consist in supplementing the preceding solution by providing an additional unit having an exponential transfer function, in order to convert the control voltage into a linear function. However, this solution poses problems as regards the practical realization of the unit, in particular as regards its thermal stability and its reproducibility.

OBJECTS AND SUMMARY OF THE INVENTION

One object of the invention is to provide a reception device in which it is possible to extract information linearly dependent on the power level received at the input of the said device.

In order to achieve this, the invention proposes to modify the profile of the control voltage as a function of the received power level by using, in the reception system, variable power attenuators for which the attenuation is controlled electronically by a control voltage and for which the dynamic range of the control voltage can have its size and position set. In this way, it will be possible to obtain a curve of the control voltage as a function of the received power level which is of hyperbolic shape. It is then sufficient to provide a unit whose transfer function is a second-degree poly nomial in order to linearize the control voltage and thus obtain information linearly dependent on the power level received at the input of the reception device.

The invention therefore relates to a device for receiving microwave signals, comprising:
 a signal input for receiving an input signal,
 a signal output for delivering an output signal,
 at least three units for processing the input signal, which processing units are mounted in cascade and produce the output signal, and
 means for slaving the power level of the output signal in order to ensure a constant power level of the output signal, which slaving means produce a control voltage acting on the gain of the said processing units by means of the said control voltage,
 characterized in that the curve of the control voltage as a function of the power level of the input signal is of hyperbolic shape,
 and in that it includes a parabolic predistorter whose transfer function is a second-degree polynomial, which parabolic predistorter is intended to linearize the control voltage.

In order to obtain a hyperbolically shaped curve of the control voltage, each unit is provided with a variable power-attenuation circuit whose attenuation is controlled electronically by the control voltage, each variable attenuation circuit including means for independently setting the size of the dynamic range of the control voltage and the position of the said dynamic range.

According to a preferred embodiment, the parabolic predistorter forms part of the slaving means. The slaving means then comprise:
 a power level detector delivering a continuous voltage proportional to the power level of the output signal of the device,
 a comparator-integrator intended to compare the said continuous voltage output by the power level detector with a setpoint voltage and to deliver an error voltage, the hyperbolic predistorter receiving the error voltage and supplying the control voltage to the variable attenuation circuits.

BRIEF DESCRIPTION OF THE DRAWINGS

Other characteristics and advantages of the invention will become apparent on reading the following detailed description, which is given with reference to the appended drawings, in which:

FIG. 2 is a diagram representing a logarithmic curve of the control voltage of the prior art devices and the hyperbolic curve of the control voltage according to the invention, and FIG. 3 is a diagram of a variable power-attenuation circuit employed in the reception device of the invention.

DESCRIPTION OF THE PREFERRED EMBODIMENTS

Figure 1:
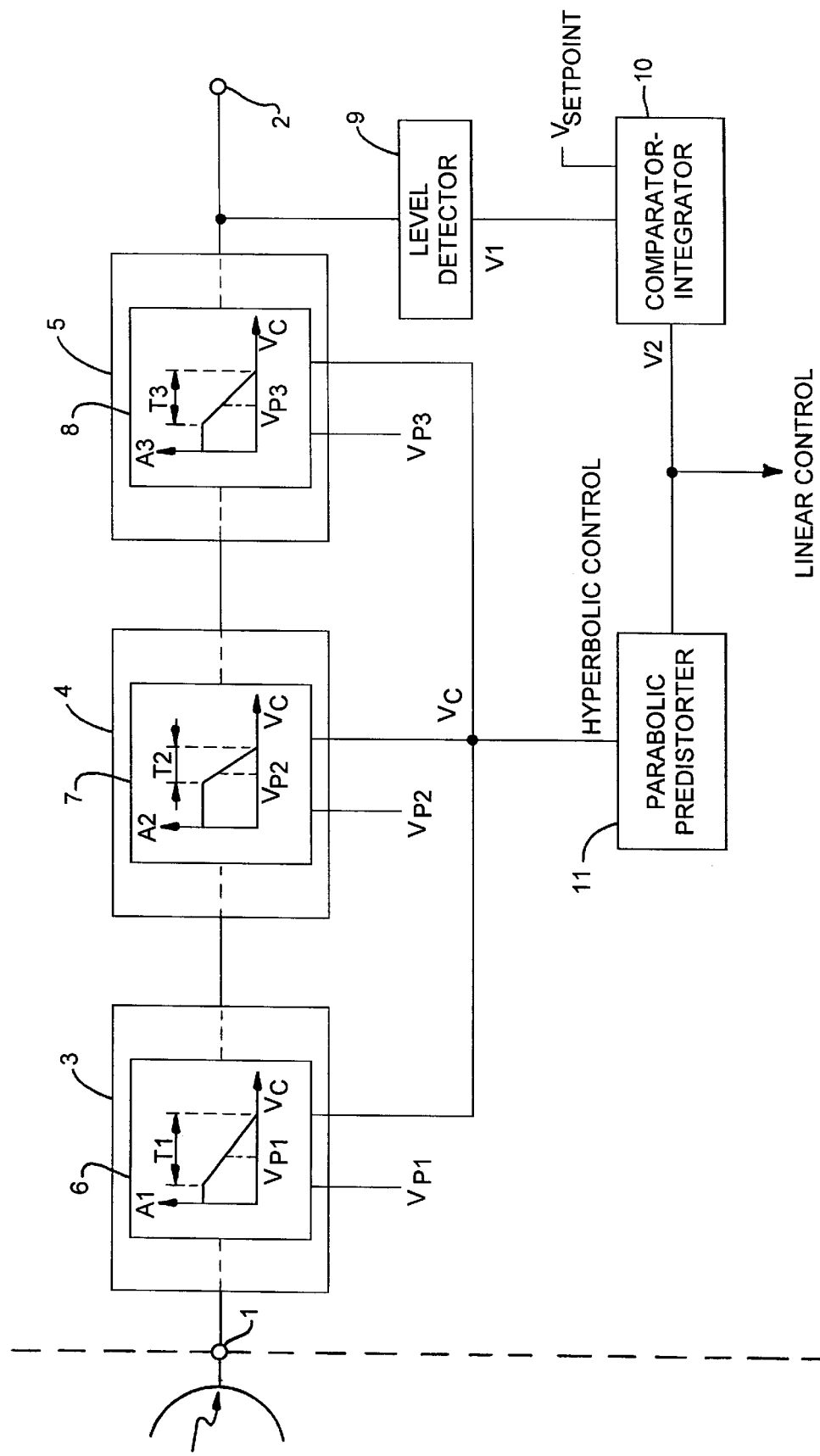
FIG. 1 is a diagram of the reception device according to the invention.

Referring to FIG. 1, the reception device of the invention is firstly composed of a main system connected between an input terminal 1 and an output terminal 2. The main system consists of three processing units 3, 4 and 5 which make it possible to amplify the signal received at the input of the device, filter it and transpose it if necessary. The input signal is picked up by an antenna placed upstream of the reception device, and the output signal is intended to be processed by a demodulator. In directional radio, since the frequencies of the input signals are high, it is conventional to use three units to bring the frequency of the signal present at the input of the device to the working frequency of the demodulator. The frequency transposition is then carried out in several steps, a first transposition being carried out for example in the unit 4 and a second in the unit 5. Mixers are then provided for this purpose in these units. The device of the invention may be used in applications which do not require frequency transposition.

Each unit includes filters, amplifiers (not shown) and a variable power attenuator which will make it possible to set the gain of each unit and thus set the overall gain of the system. These attenuators are electronically controlled by a control voltage Vc. The unit 3 includes an attenuator 6 which introduces an attenuation A1. The dynamic range of the control voltage Vc associated with this attenuator is centred on the value Vp1 and has a width or size T1. Each parameter should be settable independently of the others. Similarly, the units 4 and 5 each include an attenuator, respectively 7 and 8, defined respectively by the following parameters (A2, Vp2, T2) and (A3, Vp3, T3). An embodiment of these variable attenuators will be described in detail in FIG. 3. The control voltage Vc of these attenuators is supplied by a slaving system. The latter will make it possible, in collaboration with the main system, to set the power level of the output signal of the device.

In order to obtain a voltage linearly dependent on the power level received at the input of the device, it is firstly necessary according to the invention for the control voltage Vc to be hyperbolic. In order to do this, it is necessary to set the position and the size of the control range of the attenuators 6, 7 and 8. By modifying the size of the control range, the slope of the attenuation will actually be modified.

FIG. 2 represents a logarithmically shaped control voltage and the hyperbolically shaped voltage which most closely approximates it. The logarithmic curve corresponds to the control voltage of the prior art devices. This figure shows two crossover points A and B. By acting on the position of the control ranges of the attenuators, the location of the points A and B will be chosen so that they lie respectively at the centre of the range of action of the attenuators 7 and 8. The voltages Vp1, Vp2 and Vp3 will thus be set in such a way that:

the attenuator 8 acts for very low power levels, the attenuator 7 acts for power levels in the region of point A, the attenuator 6 acts for power levels in the region of point B.

It is then sufficient to act on the slope of the attenuation curve of the circuits 6, 7 and 8 so that the three logarithmic curve portions which are obtained define a curve approximating a hyperbola branch. It is then very easy to obtain a linear function on the basis of this hyperbolic function; to do this it is sufficient to multiply it by a second-degree polynomial function. This multiplication is carried out by the parabolic predistorter which is described below in the present description.

Referring again to FIG. 1, the slaving system includes a power level detector whose input is connected to the output 2 of the reception device. This level detector supplies a continuous voltage V1 proportional to the power level of the signal present at the output 2. The resulting voltage V1 is applied on a first input of a comparator-integrator 10 and a setpoint voltage Vset point is applied on a second input of this comparator-integrator. The setpoint voltage determines the power level desired at the output 2. In practice, this comparator-integrator consists of an operational amplifier whose output is fed back to the negative input via a capacitor, the setpoint voltage being applied on its positive input. It delivers an error voltage V2 on its output. It gives the slaving loop an infinite gain at the moment when the control voltage is acquired, and its capacitor makes it possible to store the voltage value corresponding to cancellation of the error voltage V2. The voltage V2 is then processed by a parabolic predistorter 11 whose transfer function is a second-degree polynomial. This polynomial unit is interposed between the output of the comparator-integrator 10 and the control inputs of the variable attenuators 6, 7 and 8 in order to linearize the control voltage Vc. It delivers the control voltage Vc. It would have been possible to place this unit outside the slaving system, for example by connecting the output of the comparator-integrator 10, on the one hand, to the control inputs of the attenuators 6, 7, 8 and, on the other hand, to the input of this unit; however, constraints of acquisition time for the slaving, in particular, make it preferable to introduce the polynomial unit inside the slaving system. The practical realization of a polynomial unit of this type is well-known to the person skilled in the art.

The reception device of the invention is a feedback system. Looking inside the loop, a linear voltage V2 is then obtained at the input of the parabolic predistorter and a hyperbolic control voltage Vc is obtained. The linear voltage V2 is the information which will make it possible to check that the reception device is operating correctly.

To complete the description of the device of the invention, the variable attenuation circuit used for realizing the invention is represented in FIG. 3. This attenuation circuit has formed the subject-matter of a patent application filed on May 23, 1997 by the same applicant, the application number of which is 97 06558. It includes a signal input IN, a signal output OUT and a control input INc on which the control voltage Vc output by the slaving means is applied. The basic structure of this circuit is a bridged-T structure composed of two resistors R20 and R21 mounted in series between the input and the signal output of the circuit, a diode D20 mounted in parallel with the said resistors and a diode D21 connected between the mid-point of the resistors and earth.

In order to impose a direct current in the diodes D20 and D21, the circuit includes a biasing device. This biasing device comprises a differential pair consisting of the bipolar transistors T20 and T21. The collector of the transistor T20 is connected to the cathode of the diode D21, whereas the collector of the transistor T21 is connected to the cathode of the diode D21 via an induction coil L21. The two branches of the differential pair are supplied with voltage by a voltage source Vcc which is connected to the anode of the diode D20 via an induction coil L20. The coils L20 and L21 have the role of cutting the alternating signal. The circuit also includes decoupling capacitors for channelling the direct current imposed by the differential pair. To do this, a first decoupling capacitor C20 is inserted between the signal input IN and the anode of the diode D20; a second capacitor C21 is inserted between the cathode of the diode D21 and earth; a third capacitor C22 is inserted between the resistor R21 and the signal output OUT; a fourth capacitor C23 is inserted between the anode and the diode D20 and the resistor R21; lastly, a fifth capacitor C24 is inserted between the induction coil L21 and earth.

The differential pair is supplied with current by a variable current source SC. Feedback resistors R27 and R28 are provided on the emitters of the transistors T20 and T21 in order better to control the proportion of current flowing in each of the branches. Thus, if these two resistors are equal and if an identical voltage is applied on the bases of the transistors T20 and T21, an identical current passes through both branches of the differential pair. Since the direct current flowing in the diodes D20 and D21 fixes the dynamic resistance of these two diodes, the variable current source therefore makes it possible to set the characteristic impedance of the circuit. In the example in FIG. 3, the variable current source SC includes a transistor T23, the collector of which is connected to the mid-point of the feedback resistors R27 and R28, the emitter of which is earthed via a variable resistor R24 intended to vary the value of the current delivered by the source, and the base of which is connected to the mid-point of a bridge of resistors R25, R26 which is connected between the supply terminal Vcc of the circuit and earth.

A reference voltage Vp is applied on one differential pair input E1. This input is connected to the base of the transistor T20. This voltage will make it possible to set the position of the dynamic range of the control voltage and corresponds to the central value of this range when the assembly is balanced. To be precise, as the reference voltage Vp increases, the voltage applied on the other input E2 of the differential pair will have to increase. Since the voltage applied on the input E2 is a fraction of the control voltage Vc, it is easy to understand that this voltage must be higher in order to obtain identical attenuation. The voltages Vp1, Vp2 and Vp3 in FIG. 1 are the respective reference voltages of the attenuators 3, 4 and 5.

Furthermore, the control voltage Vc is applied on the base of the transistor T21, which constitutes the input E2, via a variable resistor bridge. This resistor bridge consists of a variable resistor R22 mounted in series with a fixed resistor R23, the combination being connected between the reference voltage Vp and the control voltage Vc. The mid-point of the resistor bridge is connected to the base of the transistor T21. The value of the resistor R22 will affect the slope of the attenuation curve, and will consequently affect the size of the dynamic range of the control voltage Vc.

The attenuator of the invention is set in the following way: the characteristic impedance of the circuit is firstly set using the variable current source. The position of the dynamic range of the control voltage Vc is then set by choosing the voltage value Vp. Lastly, the slope of the attenuation curve is set by means of the resistor R22.

What is claimed is:
1. Device for receiving microwave signals, comprising:
   a signal input (1) for receiving an input signal,
   a signal output (2) for delivering an output signal,
   at least three units (3, 4, 5) for processing the input signal, which processing units are mounted in cascade and produce the output signal, and
   means for slaving the power level of the output signal in order to ensure a constant power level of the output signal, which slaving means produce a control voltage (Vc) acting on the gain of the said processing units (3, 4, 5) by means of the said control voltage (Vc),
   characterized in that the curve of the control voltage (Vc) as a function of the power level of the input signal is of hyperbolic shape,
   and in that it includes a parabolic predistorter (11) whose transfer function is a second-degree poly nomial, which parabolic predistorter is intended to linearize the control voltage (Vc).

2. Reception device according to claim 1, characterized in that, in order for the curve of the control voltage (Vc) as a function of the power level of the input signal to be of hyperbolic shape, each unit is provided with a variable power-attenuation circuit whose attenuation is controlled electronically by the control voltage (Vc), each variable attenuation circuit including means for independently setting the size of the dynamic range of the control voltage (Vc) and the position of the said dynamic range.

3. Reception device according to claim 2, characterized in that the variable attenuation circuit includes two resistors (R20, R21) mounted in series between a signal input terminal (IN) and an output terminal (OUT) of the circuit, a first diode (D20) mounted in parallel with the said resistors (R20, R21) and connected between the signal input (IN) and the output (OUT) of the circuit, a second diode (D21) connected between the mid-point of the two resistors and earth, and a biasing device intended to set the direct current passing through the diodes,
   and in that the biasing device consists of a differential pair (T20, T21), a first branch of which is connected to the cathode of the first diode (D20) and a second branch of which is connected to the cathode of the second diode (D21), the anode of the said first diode (D20) being connected to a continuous supply terminal (Vcc), the said differential pair (T20, T21) being supplied by a variable current source (SC) in order to set the characteristic impedance of the attenuator circuit and receiving, on a first input (E1), a reference voltage (Vp) intended to position the dynamic range of the control voltage of the circuit and, on a second input (E2), the control voltage (Vc) by means of a first bridge of variable resistors (R22, R23), which first resistor bridge is intended to set the size of the dynamic range of the control voltage (Vc).

4. Reception device according to claim 1, characterized in that the parabolic predistorter (11) forms part of the slaving means.

5. Reception device according to claim 4, characterized in that the slaving means include:
   a power level detector (9) delivering a continuous voltage (V1) proportional to the power level of the output signal of the device,
   a comparator-integrator (10) intended to compare the said continuous voltage (V1) output by the power level detector (9) with a setpoint voltage (Vset point) and to deliver an error voltage (V2), the hyperbolic predistorter (11) receiving the error voltage (V2) and supplying the control voltage (Vc) to the variable attenuation circuits (6, 7, 8).

6. Reception device according to claim 1, characterized in that it includes three processing units (3, 4, 5), and in that the frequency of the input signal is equal to the frequency of the output signal.

7. Reception device according to claim 1, characterized in that it includes three microwave signal-processing units,
   and in that the frequency of the output signal is less than the frequency of the input signal, the reduction in the frequency being brought about by the said processing units.

* * * * *